United States Patent
Taguchi et al.

(10) Patent No.: US 7,571,260 B2
(45) Date of Patent: Aug. 4, 2009

(54) CPU ADDRESS DECODING WITH MULTIPLE TARGET RESOURCES

(75) Inventors: Shinichiro Taguchi, Nukata-gun (JP); Kenji Yamada, Nukata-gun (JP); Hideaki Ishihara, Okazaki (JP)

(73) Assignee: DENSO CORPORATION, Kariya (JP)

( * ) Notice: Subject to any disclaimer, the term of this patent is extended or adjusted under 35 U.S.C. 154(b) by 259 days.

(21) Appl. No.: 11/541,771

(22) Filed: Oct. 3, 2006

(65) Prior Publication Data

US 2007/0076518 A1   Apr. 5, 2007

(30) Foreign Application Priority Data

Oct. 4, 2005   (JP) ............................. 2005-291247

(51) Int. Cl.
*G06F 3/00* (2006.01)
*G11C 8/00* (2006.01)
(52) U.S. Cl. .......................................... 710/3; 365/236
(58) Field of Classification Search ..................... 710/3; 365/236

See application file for complete search history.

(56) References Cited

U.S. PATENT DOCUMENTS 5,335,336 A * 8/1994 Kametani .................. 711/106
2003/0112670 A1 * 6/2003 Oberlaender et al. ........ 365/200

FOREIGN PATENT DOCUMENTS

JP   A-2004-362176   12/2004

* cited by examiner

*Primary Examiner*—Henry W. H. Tsai
*Assistant Examiner*—Tushar S Shah
(74) *Attorney, Agent, or Firm*—Posz Law Group, PLC (57) ABSTRACT

A microcomputer includes a CPU, multiple resources, and an output circuit having an address decoder. The CPU outputs an address signal to the address decoder. The address decoder decodes the address signal and the output circuit outputs a select signal to at least one of the resources in accordance with the decoded address signal. Each of the resources is writable by the CPU when receiving the select signal. When the address signal indicates a predetermined address, the output circuit outputs the select signal to at least two of the resources at a time. Thus, data can be written to the multiple resources at a time. Therefore, the CPU can write the data to the multiple resources within a reduced time by using the output circuit.

9 Claims, 9 Drawing Sheets

| Sa | Sw | RS1 | RS2 | RS3 |
|---|---|---|---|---|
| * | INACTIVE | INACTIVE | INACTIVE | INACTIVE |
| 1 | ACTIVE | ACTIVE | INACTIVE | INACTIVE |
| 2 | ACTIVE | INACTIVE | ACTIVE | INACTIVE |
| 3 | ACTIVE | INACTIVE | INACTIVE | ACTIVE |
| 4 | ACTIVE | ACTIVE | ACTIVE | INACTIVE |
| 5 | ACTIVE | INACTIVE | ACTIVE | ACTIVE |
| 6 | ACTIVE | ACTIVE | INACTIVE | ACTIVE |
| 7 | ACTIVE | ACTIVE | ACTIVE | ACTIVE |

| Dr | RSw1 | RSw2 | RSw3 |
|---|---|---|---|
| 0×0∗∗∗ ~ 0×1∗∗∗ | INACTIVE | INACTIVE | INACTIVE |
| 0×2∗∗∗ ~ 0×3∗∗∗ | ACTIVE | INACTIVE | INACTIVE |
| 0×4∗∗∗ ~ 0×5∗∗∗ | INACTIVE | ACTIVE | INACTIVE |
| 0×6∗∗∗ ~ 0×7∗∗∗ | INACTIVE | INACTIVE | ACTIVE |
| 0×8∗∗∗ ~ 0×9∗∗∗ | ACTIVE | ACTIVE | INACTIVE |
| 0×A∗∗∗ ~ 0×B∗∗∗ | INACTIVE | ACTIVE | ACTIVE |
| 0×C∗∗∗ ~ 0×D∗∗∗ | ACTIVE | INACTIVE | ACTIVE |
| 0×E∗∗∗ ~ 0×F∗∗∗ | ACTIVE | ACTIVE | ACTIVE |

FIG. 8

| Dr | CDr |
|---|---|
| 0×0∗∗∗ ~ 0×1∗∗∗ | 0×0∗∗∗ |
| 0×2∗∗∗ ~ 0×3∗∗∗ | 0×1∗∗∗ |
| 0×4∗∗∗ ~ 0×5∗∗∗ | 0×2∗∗∗ |
| 0×6∗∗∗ ~ 0×7∗∗∗ | 0×3∗∗∗ |
| 0×8∗∗∗ ~ 0×9∗∗∗ | 0×4∗∗∗ |
| 0×A∗∗∗ ~ 0×B∗∗∗ | 0×5∗∗∗ |
| 0×C∗∗∗ ~ 0×D∗∗∗ | 0×6∗∗∗ |
| 0×E∗∗∗ ~ 0×F∗∗∗ | 0×7∗∗∗ |

FIG. 9A  CLK

FIG. 9B  CPU

FIG. 9E  RSr1 RSr2 RSr3

FIG. 9F  Dr

FIG. 9G  RSw1 RSw2 RSw3

FIG. 9H  CDr

| Sa | Sw | S1 | S2 | S3 |
|---|---|---|---|---|
| * | INACTIVE | INACTIVE | INACTIVE | INACTIVE |
| 1 | ACTIVE | ACTIVE | INACTIVE | INACTIVE |
| 2 | ACTIVE | INACTIVE | ACTIVE | INACTIVE |
| 3 | ACTIVE | INACTIVE | INACTIVE | ACTIVE |

FIG. 12
PRIOR ART

CPU ADDRESS DECODING WITH MULTIPLE TARGET RESOURCES

CROSS REFERENCE TO RELATED APPLICATION

This application is based on and incorporates herein by reference Japanese Patent Application No. 2005-291247 filed on Oct. 4, 2005.

FIELD OF THE INVENTION

The present invention relates to a microcomputer.

BACKGROUND OF THE INVENTION

In a communication application, a microcomputer receives data and forwards the data to multiple destinations. A central processing unit (CPU) of the microcomputer sequentially writes the data to send buffers each of which corresponds to each destination.

Figure 10:
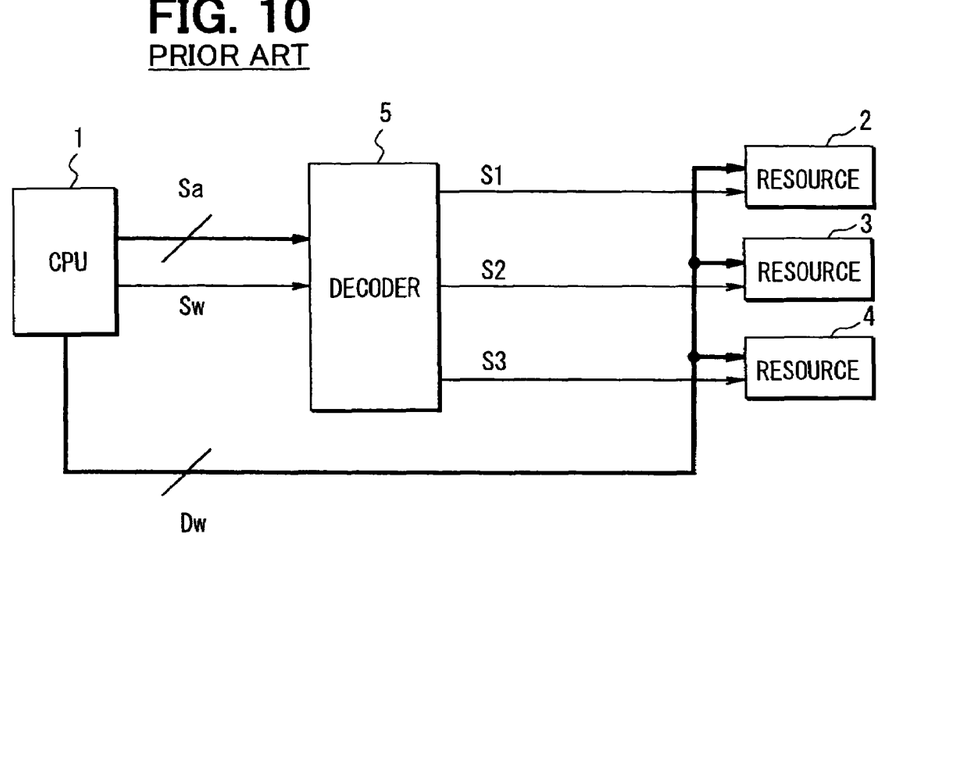
FIG. 10 is a block diagram of a conventional microcomputer.
Figure 11:
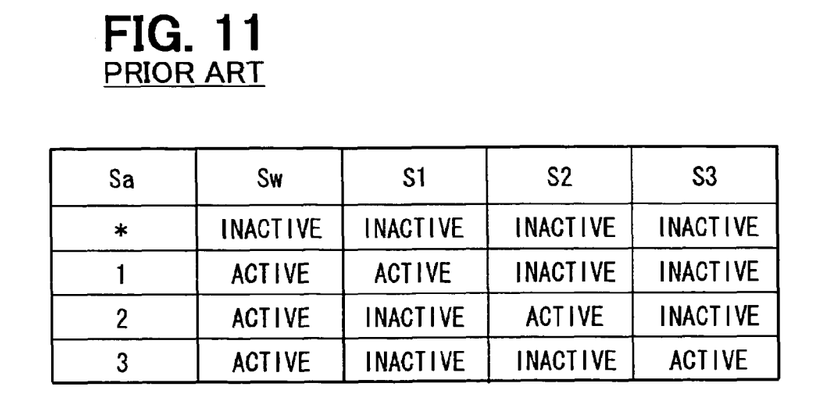
FIG. 11 is a table showing a relationship between a logical address signal and select signals of the microcomputer of FIG. 10.
Figure 12:
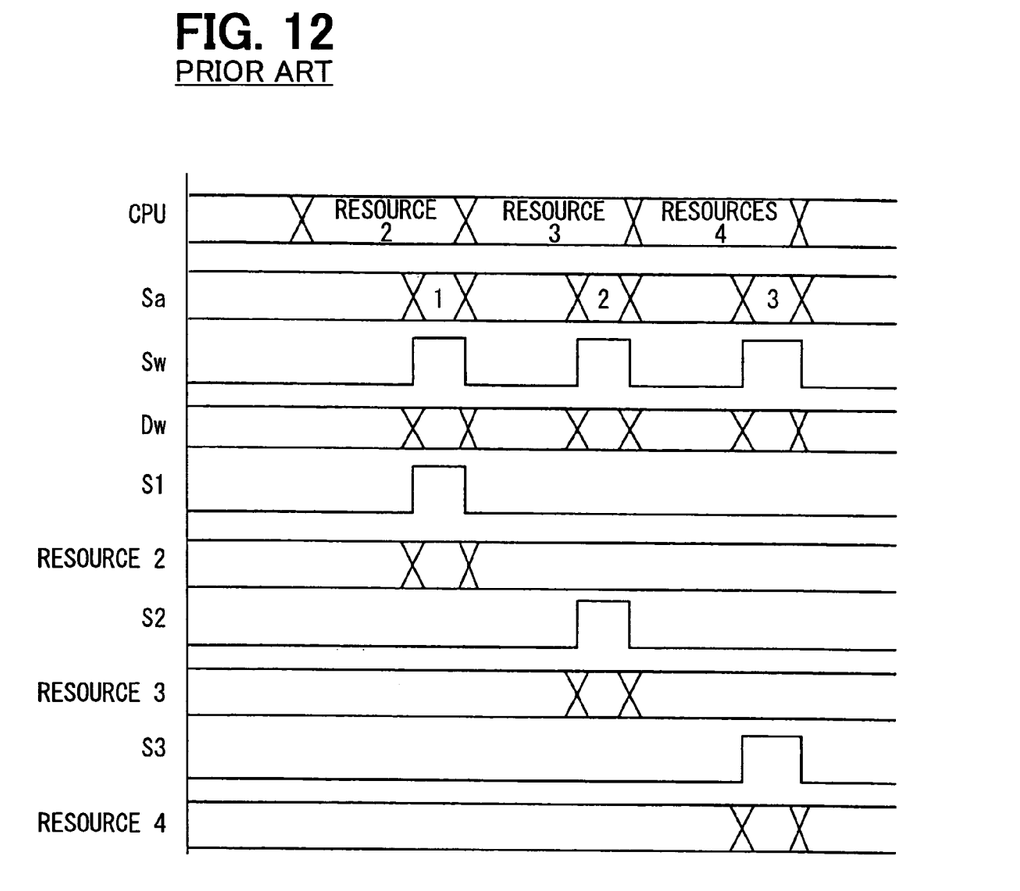
FIG. 12 is a timing chart of the microcomputer of FIG. 10.

In the case of FIG. 10, a CPU 1 writes write data Dw to three resources 2-4 such as peripheral circuits. The CPU 1 sequentially outputs a write enable signal Sw and an address signal Sa to an address decoder 5. The address decoder 5 decodes the address signal Sa and sequentially outputs one of select signals S1-S3 corresponding to the resources 2-4, respectively, in accordance with the decoded address signal Sa. As shown in FIGS. 11 and 12, therefore, the CPU 1 serially writes the write data Dw to the resources 2-4. The serial writing processing may introduce a delay into the communication processing.

JP-2004-362176A discloses a technique to overcome the above problem. In JP-2004-362176A, a host I/F 101 and a sequence block 102 are interposed between a host computer 200 and functional blocks 103-105. The host computer 200 sets a parameter STA in the sequence block 102, when the host computer 200 writes data to the functional blocks 103-105. Then, the sequence block 102 writes the data to the functional blocks 103-105 in accordance with the parameter STA.

The technique shortens the processing time of the host computer 200. However, the sequence block 102 writes the data to the functional blocks 103-105 in a cycle similar to that shown in FIG. 12. Therefore, the technique cannot shorten the overall processing time.

SUMMARY OF THE INVENTION

In view of the above-described problem, it is an object of the present invention to provide a microcomputer in which a central processing unit writes data to multiple resources within a reduced time.

A microcomputer includes a central processing unit (CPU), multiple resources, and an output circuit having an address decoder.

The CPU outputs an address signal to the address decoder. The address decoder decodes the address signal and the output circuit outputs a select signal to at least one of the resources in accordance with the decoded address signal. Each of the resources is writable by the CPU when receiving the select signal.

When the address signal indicates a predetermined address, the output circuit outputs the select signal to at least two of the resources at a time. Thus, data can be written to the multiple resources at a time. Therefore, the CPU can write the data to the multiple resources within a reduced time by using the output circuit.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
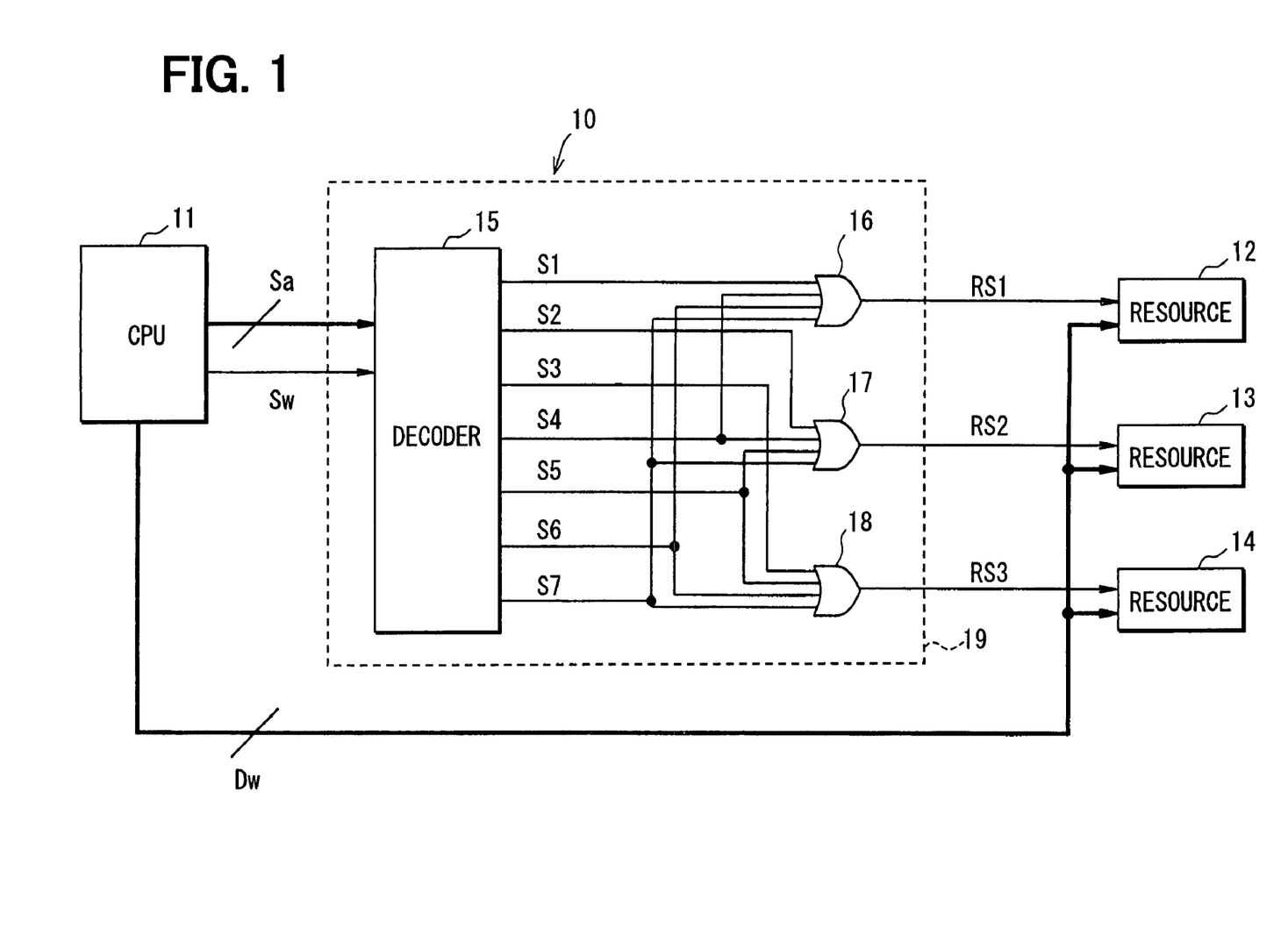
FIG. 1 is a block diagram of a microcomputer according to a first embodiment of the present invention.

Referring to FIG. 1, a microcomputer 10 includes a central processing unit (CPU) 11, three resources 12-14, and a signal output circuit 19. The output circuit 19 has an address decoder 15 and three OR gates 16-18. The CPU 11 writes write data Dw to the resources 12-14 through the output circuit 19.

When the CPU 11 writes the write data Dw to the resources 12-14, the CPU 11 sends a write enable signal Sw and an address signal Sa to the address decoder 15 of the output circuit 19. The address decoder 15 decodes the address signal Sa into select signals S1-S7 in accordance with an address value of the address signal Sa.

As shown in FIG. 1, the select signals S1, S4, S6, and S7 are input to the OR gate 16. The OR gate 16 outputs a select signal RS1 to the resource 12 in response to the select signals S1, S4, S6, and S7. The select signals S2, S4, S5, and S7 are input to the OR gate 17. The OR gate 17 outputs a select signal RS2 to the resource 13 in response to the select signals S2, S4, S5, and S7. The select signals S3, S5, S6, and S7 are input to the OR gate 18. The OR gate 18 outputs a select signal RS3 to the resource 14 in response to the select signals S3, S5, S6, and S7.

Figure 2:
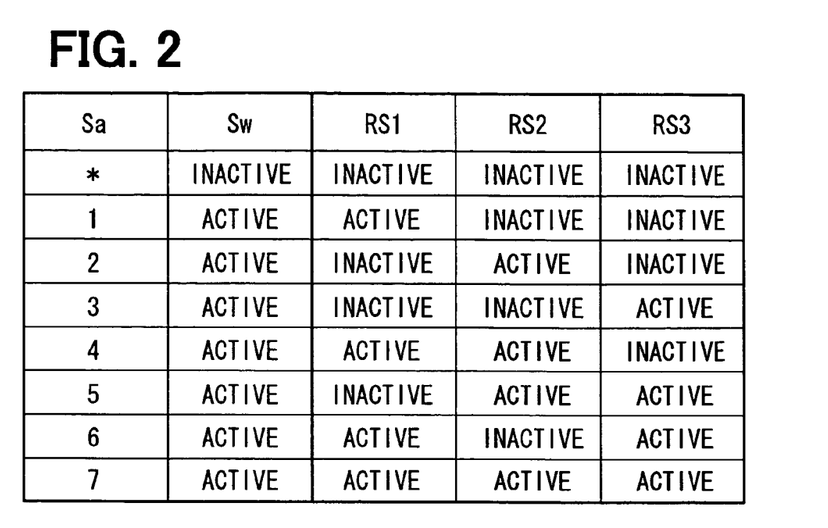
FIG. 2 is a table showing a relationship between a logical address signal and select signals of the microcomputer of FIG. 1.
Figure 3:
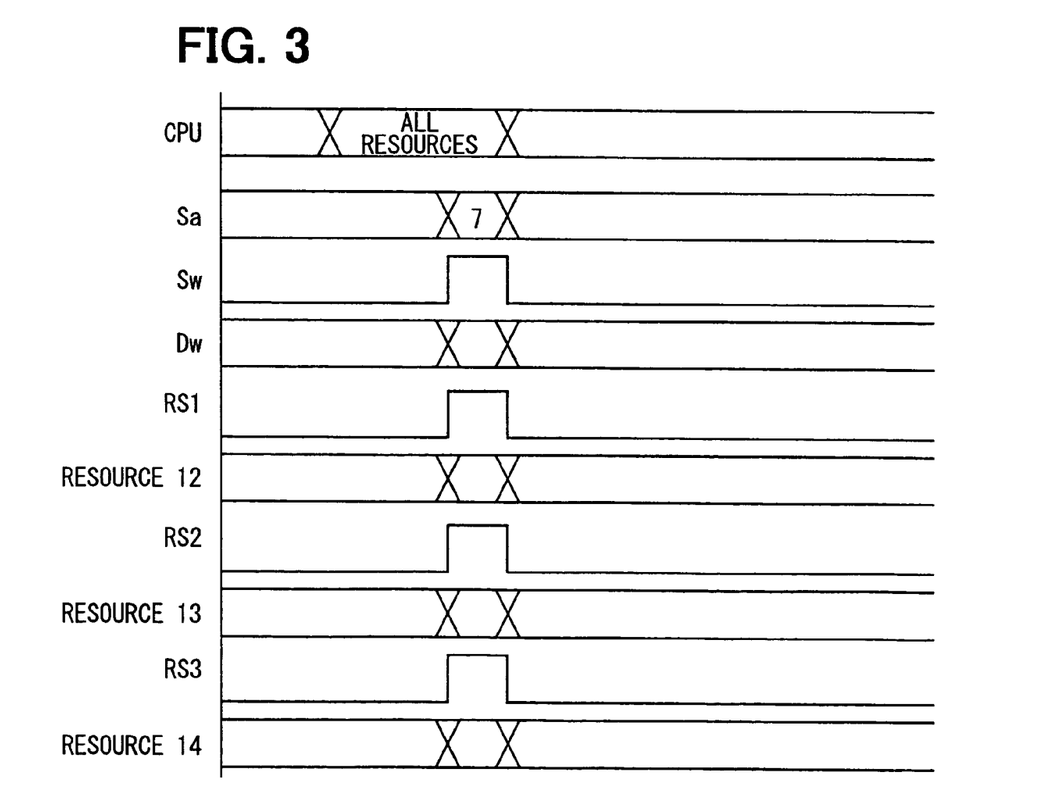
FIG. 3 is a timing chart of the microcomputer of FIG. 1.

Operations of the output circuit 19 are described with further reference to FIGS. 2 and 3.

As shown in FIG. 2, the address signal Sa has the address value ranging from 1 to 7. The address signal Sa of 1-3 is assigned to the resources 12-14, respectively. When the CPU 11 sends the write enable signal Sw and the address signal Sa of 1-3 to the address decoder 15, the address decoder 15 outputs the select signals S1-S3, respectively. The select signals S1-S3 are input to the OR gates 16-18, respectively. Then, the OR gates 16-18 outputs the select signals RS1-RS3 to the resources 12-14, respectively. Thus, when the CPU 11 sends the address signal Sa of 1-3 to the address decoder 15, the select signals RS1-RS3 are active, respectively. Therefore, the resources 12-14 are selected and the write data Dw is written to the resources 12-14, respectively.

The address signal Sa of 4 is assigned to both the resources 12, 13. When the CPU 11 sends the write enable signal Sw and the address signal Sa of 4 to the address decoder 15, the address decoder 15 outputs the select signal S4. The select signal S4 is input to each of the OR gates 16, 17. Then, the OR gates 16, 17 output the select signals RS1, RS2 to the resources 12, 13, respectively. Thus, when the CPU 11 sends the address signal Sa of 4 to the address decoder 15, both the select signals RS1, RS2 are active. Therefore, both the resources 12, 13 are selected at a time so that the write data Dw is written to both the resources 12, 13 at a time.

The address signal Sa of 5 is assigned to both the resources 13, 14. When the CPU 11 sends the write enable signal Sw and the address signal Sa of 5 to the address decoder 15, the address decoder 15 outputs the select signal S5. The select signal S5 is input to each of the OR gates 17, 18. Then, the OR gates 17, 18 output the select signals RS2, RS3 to the resources 13, 14, respectively. Thus, when the CPU 11 sends the address signal Sa of 5 to the address decoder 15, both the select signals RS2, RS3 are active. Therefore, both the resources 13, 14 are selected at a time so that the write data Dw is written to both the resources 13, 14 at a time.

The address signal Sa of 6 is assigned to both the resources 12, 14. When the CPU 11 sends the write enable signal Sw and the address signal Sa of 6 to the address decoder 15, the address decoder 15 outputs the select signal S6. The select signal S6 is input to each of the OR gates 16, 18. Then, the OR gates 16, 18 output the select signals RS1, RS3 to the resources 12, 14, respectively. Thus, when the CPU 11 sends the address signal Sa of 6 to the address decoder 15, both the select signals RS1, RS3 are active. Therefore, both the resources 12, 14 are selected at a time so that the write data Dw is written to both the resources 12, 14 at a time.

The address signal Sa of 7 is assigned to all the resources 12-14. When the CPU 11 sends the write enable signal Sw and the address signal Sa of 7 to the address decoder 15, the address decoder 15 outputs the select signal S7. The select signal S7 is input to all the OR gates 16-18. Then, the OR gates 16-18 output the select signals RS1-RS3 to the resources 12-14, respectively. Thus, when the CPU 11 sends the address signal Sa of 7 to the address decoder 15, all the select signals RS1-RS3 are active. Therefore, all the resources 12-14 are selected at a time so that the write data Dw is written to all the resources 12-14 at a time, as shown in FIG. 3.

In the microcomputer 10, when the CPU 11 sends the address signal Sa of 4-7 to the output circuit 19, the output circuit 19 outputs two or all of the select signals RS1-RS3 at a time. Thus, two or all of the resources 12-14 are selected at a time so that the write data Dw can be written to two or all of the resources 12-14 at a time. Therefore, the CPU 11 can write the write data Dw to the resources 12-14 within a reduced time by using the output circuit 19. The output circuit 19 can be easily implemented with the OR gates 16-18 corresponding to the resources 12-14, respectively.

Second Embodiment

Figure 4:
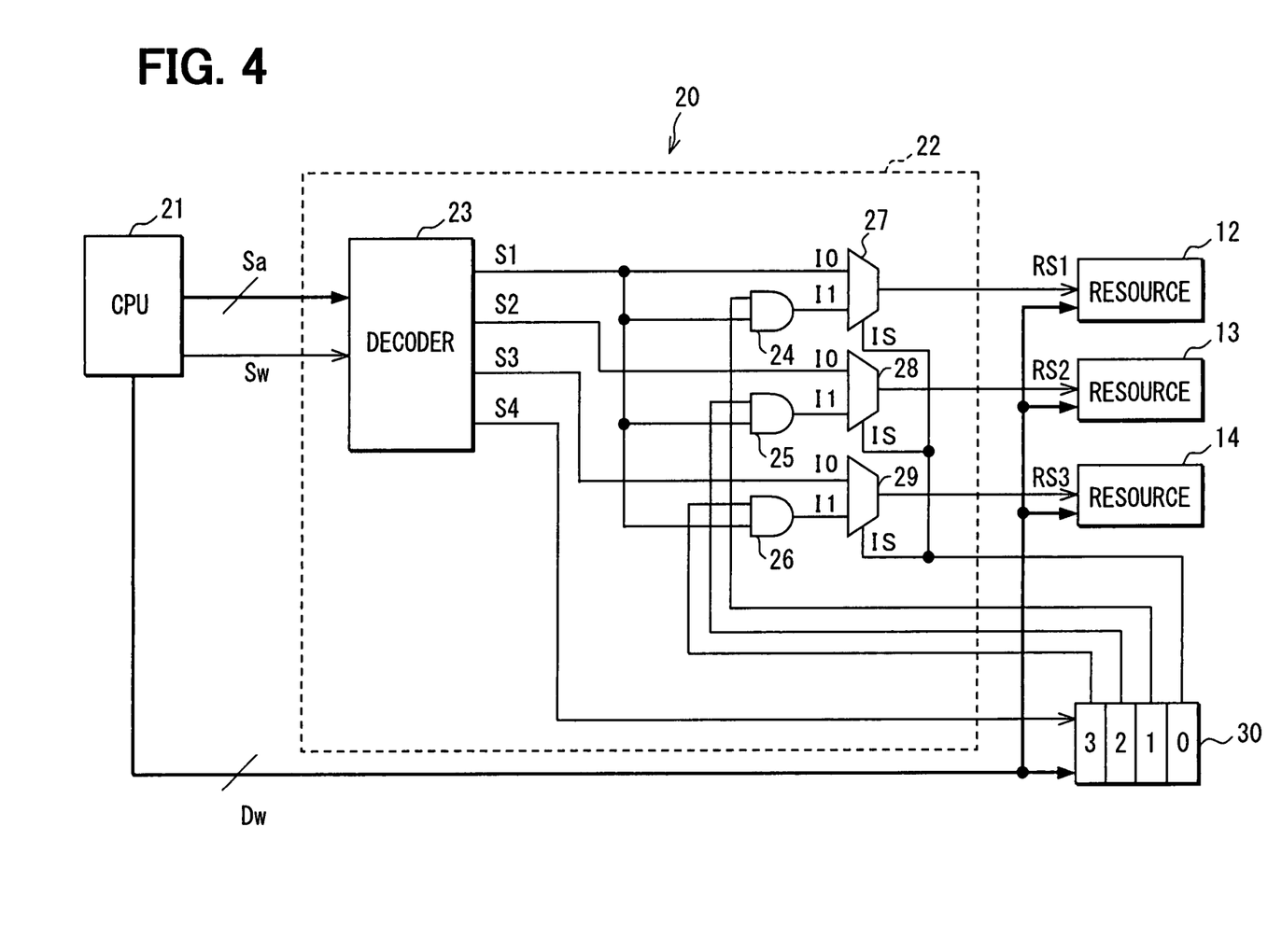
FIG. 4 is a block diagram of a microcomputer according to a second embodiment of the present invention.

Referring to FIG. 4, a microcomputer 20 includes a CPU 21, resources 12-14, and an output circuit 22. The output circuit 22 has an address decoder 23, a multiple select enable register 30, AND gates 24-26, and multiplexers 27-29 each of which have two input terminals I0, I1 and one select terminal IS. The CPU 21 writes write data Dw to the resources 12-14 through the output circuit 22.

When the CPU 21 writes the write data Dw to the resources 12-14, the CPU 21 sends the write enable signal Sw and an address signal Sa to the address decoder 23 of the output circuit 22. The address signal Sa has an address value ranging from 1 to 4. The address decoder 23 decodes the address signal Sa into select signals S1-S4 in accordance with the address value.

As shown in FIG. 4, the select signals S1-S3 are input to the input terminals I0 of the multiplexers 27-29, respectively. Further, the select signal S1 is input to one input terminal of each of the AND gates 24-26. Output terminals of the AND gates 24-26 are connected to the input terminals I1 of the multiplexers 27-29, respectively.

The enable register 30 is a 4-bit register. Bit 0 of the enable register 30 indicates whether a multiple select is enable. In other words, when the bit 0 of the enable register 30 is set to a predetermined value, at least two of the resources 12-14 can be selected at a time.

Specifically, when the bit 0 of the enable register 30 is set to a value of 1, the multiple select is enable so that at least two of the resources 12-14 can be selected at a time. In contrast, when the bit 0 of the enable register 30 is set to a value of 0, the multiple select is disable so that only one of the resources 12-14 can be selected at a time.

The bit 0 of the enable register 30 is connected to each selection terminal IS of the multiplexers 27-29. When the bit 0 of the enable register 30 is set to the value of 0, each of the multiplexers 27-29 switches to the input terminal I0. In contrast, when the bit 0 of the enable register 30 is set to the value of 1, the multiplexers 27-29 switches to the input terminal I1.

Bits 1-3 of the enable register 30 indicate which of the resources 12-14 is selected. The bits 1-3 of the enable register 30 are connected to the other input terminals of the AND gates 24-26, respectively.

Operations of the output circuit 22 are described below.

The enable register 30 is initially reset to all zeros, i.e., each value of the bits 0-3 of the enable register 30 is 0. Therefore, each of the multiplexers 27-29 selects the input terminal I0.

In the initial state, the address signal Sa of 1-3 is assigned to the resources 12-14, respectively. When the CPU 21 sends the write enable signal Sw and the address signal Sa of 1-3 to the address decoder 23 of the output circuit 22, the address decoder 23 outputs the select signals S1-S3, respectively. The select signals S1-S3 are input to the input terminals I0 of the multiplexers 27-29, respectively. Then, the multiplexers 27-29 output the select signals RS1-RS3 to the resources 12-14, respectively. Thus, when the CPU 21 sends the address signal Sa of 1-3 to the address decoder 23, the resources 12-14 are selected and the write data Dw is written to the resources 12-14, respectively.

In the case of selecting at least two of the resources 12-14 at a time, the CPU 21 initially sends the write enable signal Sw and the address signal Sa of 4 to the address decoder 23. Then, the address decoder 23 outputs the select signal S4 to the enable register 30. Thus, the enable register 30 is selected so that the write data Dw can be written to the enable register 30.

The write data Dw sets the bit 0 of the enable register 30 to the value of 1 so that the multiplexers 27-29 switch to the input terminal I1. Further, the write data Dw sets the bits 1-3, corresponding to the resources 12-14 to be selected at a time, to the value of 1. For example, when the resources 12,14 are selected at a time, the bits 1, 3 of the enable register 30 are set to the value of 1. Thus, the multiple select is enable.

After the multiple select is enable, the CPU 21 sends the address signal Sa of 1 to the address decoder 23. The address decoder 23 outputs the select signal S1 in response to the address signal Sa of 1. The select signal S1 is input to the one input terminal of each of the AND gates 24-26. Since the bits 1,3 of the enable register 30 are connected to the other input terminals the AND gates 24, 26, respectively, the outputs of the AND gates 24, 26 are asserted. Then, since the multiplexers 27, 29 select the input terminal I1, the multiplexers 27, 29 output the select signals RS1, RS3 to the resources 12, 14, respectively. Thus, both the resources 12, 14 are selected at a time so that the write data Dw is written to both the resources 12, 14 at a time.

By resetting the bit 0 of the enable register 30 to the value of 0, the CPU 21 can select one of the resources 12-14 again.

As described above, in the case that the CPU 21 selects at least two of the resources 12-14 at a time, the bit 0 of the enable register 30 is set to the value of 1 and the bits 1-3, corresponding to the resources 12-14 to be selected at a time, are set to the value of 1. Then, the CPU 21 outputs the address signal Sa of 1 to the address decoder 23 and the address decoder 23 outputs the select signal S1. The multiplexers 27-29 assert the select signals RS1-RS3, respectively, in accordance with the AND operation between the select signal S1 and the bits 1-3 of the enable register 30. Thus, at least two of the resources 12-14 are selected at a time so that the CPU 21 can write the write data Dw to at least two of the resources 12-14 at a time.

Therefore, the CPU 21 can write the write data Dw to the resources 12-14 within a reduced time by using the output circuit 22.

Third Embodiment

Figure 5:
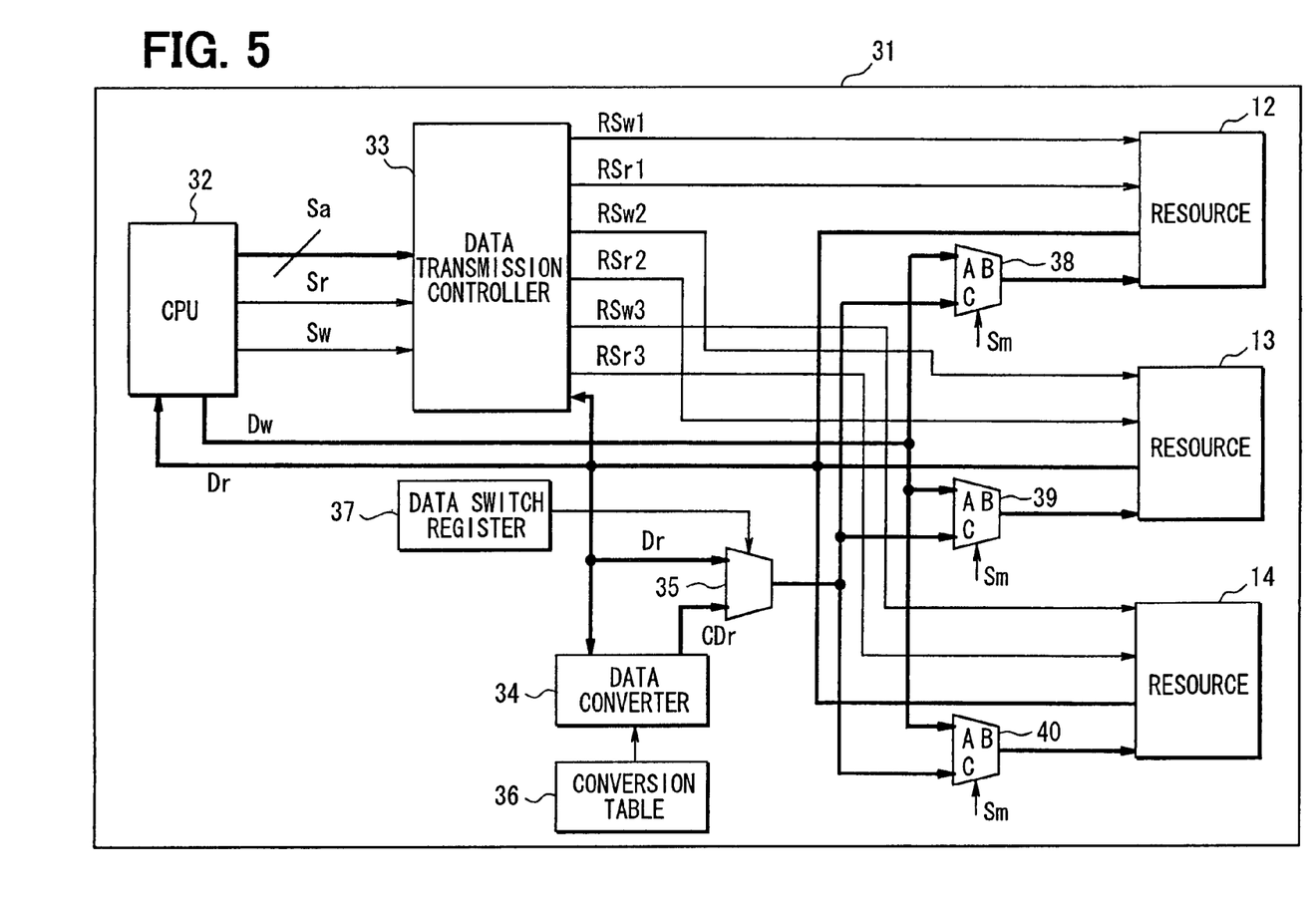
FIG. 5 is a block diagram of a microcomputer according to a third embodiment of the present invention.

Referring to FIG. 5, a microcomputer 31 includes a CPU 32, a data transmission controller 33, a data converter 34, a multiplexer 35, a conversion table 36, a data switch register 37, multiplexers 38-40, and resources 12-14.

The CPU 32 writes write data Dw to the resources 12-14 and reads read data Dr from the resources 12-14 through the controller 33. The CPU 32 has three operating modes A, B, and C. The modes A, B correspond to the first and second embodiments, respectively.

The controller 33 receives an address signal Sa, a write enable signal Sw, a read enable signal Sr from the CPU 32 and receives the read data Dr from the resources 12-14. The controller 33 outputs write select signals RSw1-RSw3 and read select signals RSr1-RSr3 to the resources 12-14 in accordance with the address signal Sa, the write enable signal Sw, the read enable signal Sr, and the read data Dr.

The read data Dr is input to the data converter 34 and the multiplexer 35. The data converter 34 converts a portion of the read data Dr in accordance with the conversion table 36 and outputs a converted data CDr to the multiplexer 35. The CPU 32 sets the data switch register 37 to a predetermined value and the multiplexer 35 selects the read data Dr or the converted data CDr in accordance with the value of the data switch register 37.

The multiplexer 35 outputs the selected data (i.e., the read data Dr or the converted data CDr) to an input terminal C of each of the multiplexers 38-40. The input terminal C corresponds to the mode C of the CPU 32. The CPU 32 outputs the write data Dw to an input terminal AB of each of the multiplexers 38-40. The input terminal AB corresponds to each of the modes A, B of the CPU 32. The multiplexers 38-40 select the selected data (i.e., the read data Dr or the converted data CDr) or the write data Dw in accordance with a mode switch signal Sm sent from a mode switch register 41 shown in FIG. 6.

Figure 6:
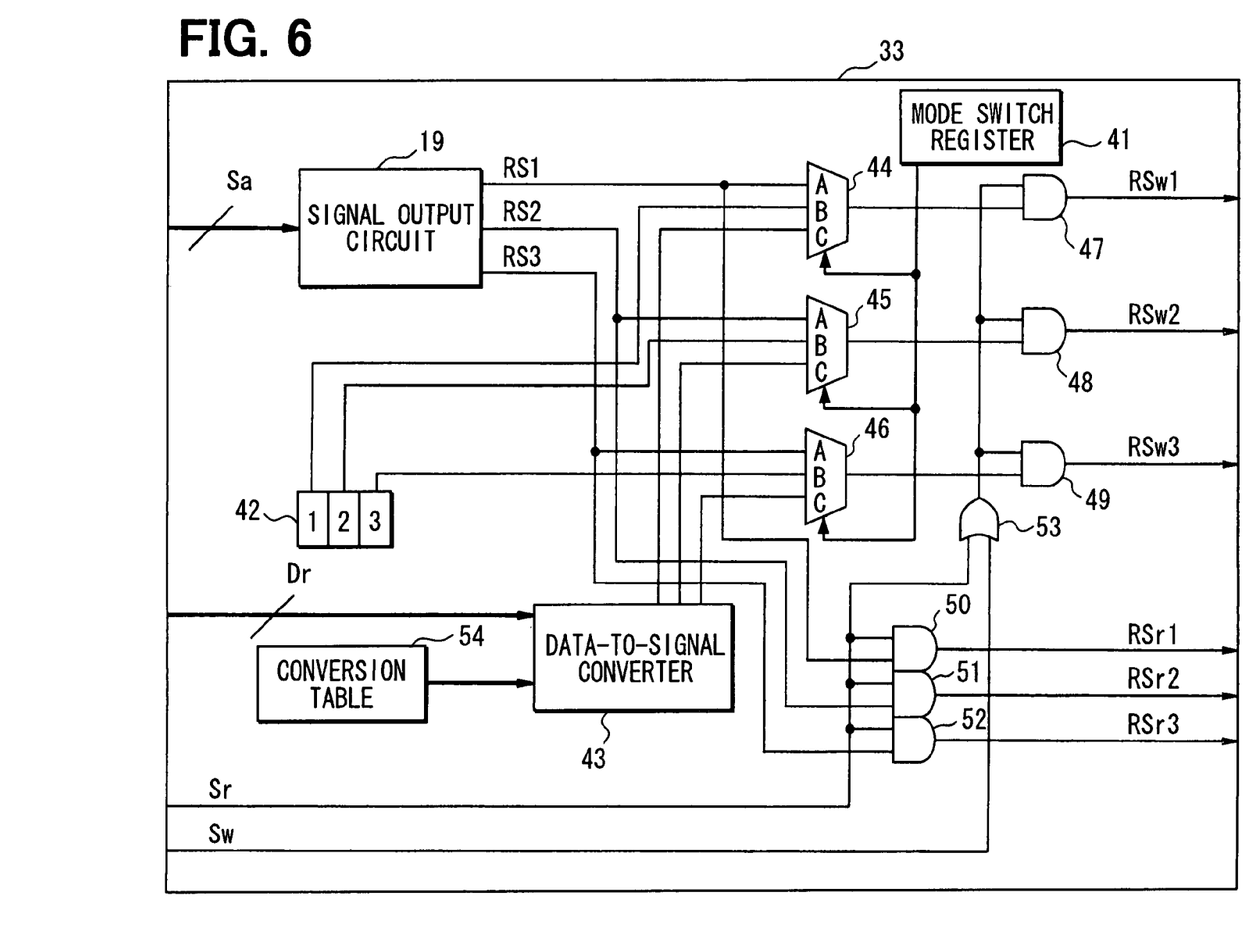
FIG. 6 is a block diagram of a data transmission controller of the microcomputer of FIG. 5.

The controller 33 is configured as shown in FIG. 6. The controller 33 includes the output circuit 19, the mode switch register 41, a multiple select enable register 42, a data-to-signal converter 43, multiplexers 44-46 each of which has three input terminals A-C, AND gates 47-52, an OR gate 53, and a conversion table 54. The input terminals A-C of each of the multiplexers 44-46 correspond to the modes A-C of the CPU 32, respectively.

The output circuit 19 outputs the select signals RS1-RS3 to the input terminals A of the multiplexers 44-46, respectively. The enable register 42 outputs the select signals RS1-RS3 to the input terminals B of the multiplexers 44-46, respectively. The data-to-signal converter 43 outputs the select signals RS1-RS3 to the input terminals C of the multiplexers 44-46, respectively. The enable register 42 is the enable register 30 having no bit 0.

Each of the multiplexers 44-46 selects one of the input terminals A-C in accordance with the mode switch signal Sm sent from the mode switch register 41. The output terminals of the multiplexers 44-46 are connected to one input terminals of the AND gates 47-49, respectively. The AND gates 47-49 outputs the write select signals RSw1-RSw3 to the resources 12-14, respectively.

Further, the select signals RS1-RS3 output from the output circuit 19 are input to one input terminals of the AND gates 50-52, respectively. The read enable signal Sr output from the CPU 32 is input to each of the other input terminals of the AND gates 50-52. The AND gates 50-52 outputs the read select signals RSr1-RSr3 to the resources 12-14, respectively.

The write enable signal Sw output from the CPU 32 is input to one input terminal of the OR gate 53. The read enable signal Sr is input to the other input terminal of the OR gate 53. The output terminal of the OR gate 53 is connected to each of the other input terminals of the AND gate 47-49.

The read data Dr is input to the data-to-signal converter 43. The data-to-signal converter 43 converts the read data Dr to the select signals RS1-RS3 in accordance with the conversion table 54 shown in FIG. 7 and outputs the select signals RS1-RS3 to the multiplexers 44-46, respectively.

Figure 7:
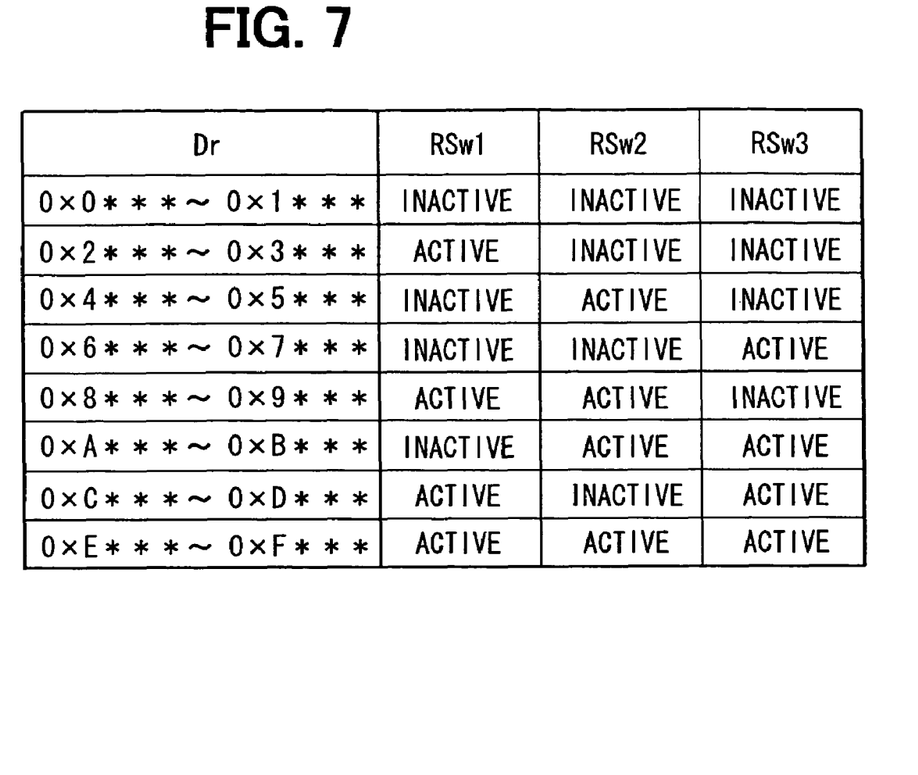
FIG. 7 is a conversion table used by a data—to signal converter of the data transmission controller of FIG. 6.

In case of the FIG. 7, the read data Dr is a 16-bit data and the CPU 32 selects the mode C.

When the first 4 bits from most significant bit (MSB) of the read data Dr indicates 0H (hexadecimal digit), or 1H, the data-to-signal converter 43 does not output the select signals RS1-RS3. Therefore, all the write select signals RSw1-RSw3 are inactive. In short, although the CPU 32 reads the read data Dr, the read data Dr is not written to the resources 12-14.

When the first 4 bits from MSB of the read data Dr indicates 2H, or 3H, the data-to-signal converter 43 outputs the select signal RS1 to the input terminal C of the multiplexer 44. Therefore, the write select signal RSw1 is active. Thus, the read data Dr is written to the resource 12 at the same time the CPU 32 reads the read data Dr.

When the first 4 bits from MSB of the read data Dr indicates 4H, or 5H, the data-to-signal converter 43 outputs the select signal RS2 to the input terminal C of the multiplexer 45. Therefore, the write select signal RSw2 is active. Thus, the read data Dr is written to the resource 13 at the same time the CPU 32 reads the read data Dr.

When the first 4 bits from MSB of the read data Dr indicates 6H, or 7H, the data-to-signal converter 43 outputs the select signal RS3 to the input terminal C of the multiplexer 46. Therefore, the write select signal RSw3 is active. Thus, the read data Dr is written to the resource 14 at the same time the CPU 32 reads the read data Dr.

When the first 4 bits from MSB of the read data Dr indicates 8H, or 9H, the data-to-signal converter 43 outputs the select signals RS1, RS2. Therefore, the write select signals RSw1, RSw2 are active. Thus, the read data Dr is written to the resources 12, 13 at the same time the CPU 32 reads the read data Dr.

When the first 4 bits from MSB of the read data Dr indicates AH, or BH, the data-to-signal converter 43 outputs the select signals RS2, RS3. Therefore, the write select signals RSw2, RSw3 are active. Thus, the read data Dr is written to the resources 13, 14 at the same time the CPU 32 reads the read data Dr.

When the first 4 bits from MSB of the read data Dr indicates CH, or DH, the data-to-signal converter 43 outputs the select signals RS1, RS3. Therefore, the write select signal RSw1, RSw3 are active. Thus, the read data Dr is written to the resources 12, 14 at the same time the CPU 32 reads the read data Dr.

When the first 4 bits from MSB of the read data Dr indicates EH, or FH, the data-to-signal converter 43 outputs all the select signals RS1-RS3. Therefore, all the write select signals RSw1-RSw3 are active. Thus, the read data Dr is written to all the resources 12-14 at the same time the CPU 32 reads the read data Dr.

As described above, the read data Dr is input to the data converter 34. The data converter 34 generates the converted data CDr by converting the portion of the read data Dr in accordance with the conversion table 36 shown in FIG. 8 and outputs the converted data CDr to the multiplexer 35.

Figure 8:
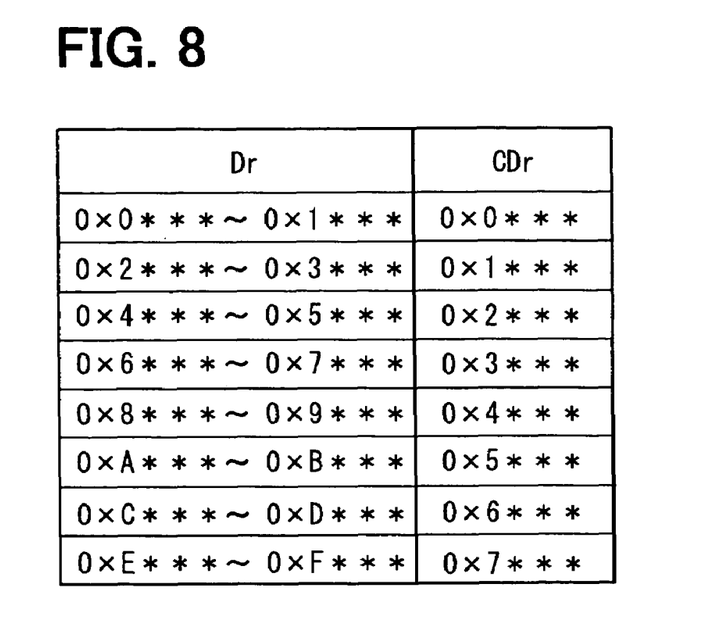
FIG. 8 is a conversion table used by a data converter of the microcomputer of FIG. 5.

As can be see from FIG. 8, when the first 4 bits from MSB of the read data Dr indicates 0H-1H, 2H-3H, 4H-5H, 6H-7H, 8H-9H, AH-BH, CH-DH, and EH-FH, the first 4 bits is converted to 0H, 1H, 2H, 3H, 4H, 5H, 6H, and 7H, respectively. Thus, the data converter 34 converts the read data Dr to the converted data CDr in accordance with the conversion table 36.

Operations of the microcomputer 31 are described with further reference to FIGS. 9A-9H.

When the CPU 32 selects the mode A by the mode switch register 41, the select signals RS1-RS3 output from the output circuit 19 are enable. Thus, the microcomputer 31 works in the same manner as the microcomputer 10 according to the first embodiment. Specifically, in write cycle, since the write enable signal Sw is input to each of the AND gates 47-49 through the OR gate 53, the AND gates 47-49 outputs the write select signals RSw1-RSw3 to the resources 12-14 in response to the select signals RS1-RS3, respectively.

When the CPU 32 selects the mode B by the mode switch register 41, the select signals RS1-RS3 output from the enable register 42 are enable. Thus, the microcomputer 31 works in the same manner as the microcomputer 20 according to the second embodiment. In short, the mode B is equivalent to setting the bit 0 of the enable register 30 to the value of 1.

Figure 9A:
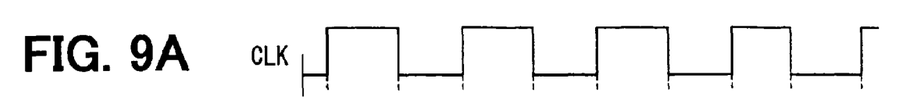
FIGS. 9A-9H are timing charts of the microcomputer of FIG. 5.

When the CPU 32 selects the mode C by the mode switch register 41, the select signals RS1-RS3 output from the data-to-signal converter 43 are enable. In read cycle, the microcomputer 31 operates as shown in FIGS. 9B-9H. In this case, an operation clock CLK is provided as shown in FIG. 9A and it is assumed that the multiplexer 35 selects the converted data CDr.

Figure 9B:
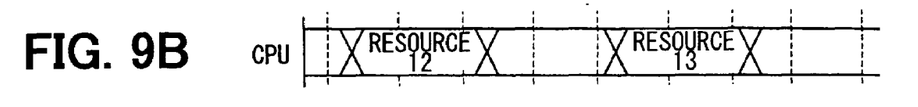
Figure 9C:
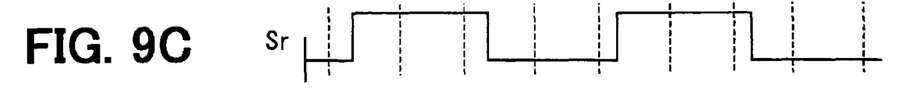
Figure 9D:
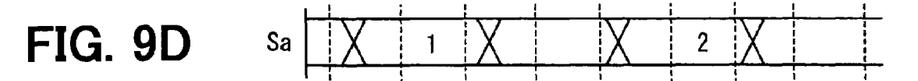
Figure 9E:
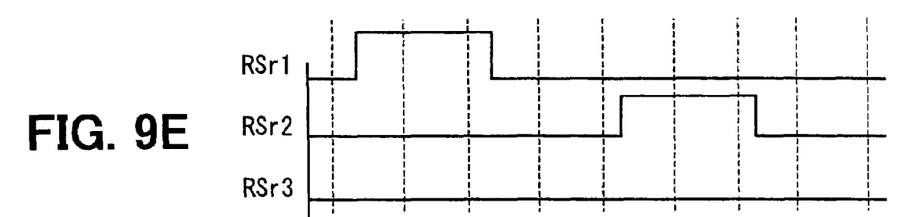

First, the CPU 32 outputs the address signal Sa of 1 and the read enable signal Sr to the controller 33 in order to read the read data Dr from the resource 12, as shown in FIGS. 9B-9D. Then, the output circuit 19 of the controller 33 outputs the select signal RS1 to the AND gate 50. Then, the AND gate 50 outputs the read select signal RSr1 to the resource 12, as shown in FIG. 9E. Thus, the CPU 32 reads the read data Dr from the resource 12.

Figure 9F:
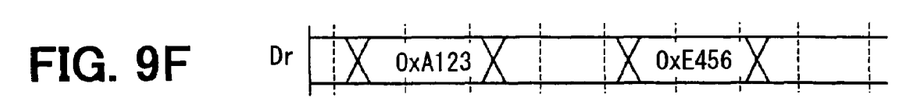
Figure 9G:
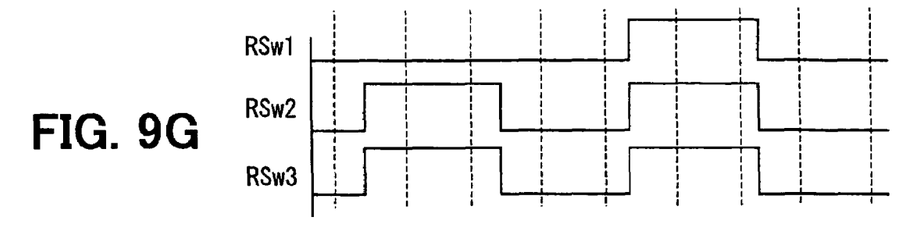

When the read data Dr is 0xA123 as shown in FIG. 9F, the data-to-signal converter 43 outputs the select signals RS2, RS3 to the multiplexers 45, 46, respectively, in accordance with the conversion table 54 shown in FIG. 7. Thus, the AND gates 48, 49 outputs the write select signals RSw2, RSw3 to the resources 13, 14, respectively, as shown in FIG. 9G.

Figure 9H:
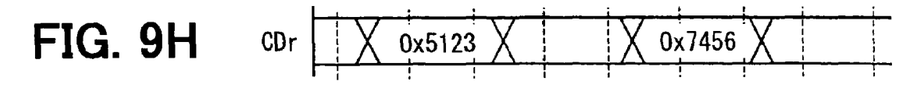

The data converter 34 converts the read data Dr of 0xA123 to the converted data CDr of 0x5123 in accordance with the conversion table 36 shown in FIG. 8. As shown in FIGS. 9G and 9H, the converted data CDr of 0x5123 is written to the resources 13, 14 at a time. Thus, the converted data CDr is written to the resources 13, 14 at the same time the CPU 32 reads the read data Dr from the resource 12.

Next, the CPU 32 outputs the address signal Sa of 2 and the read enable signal Sr to the controller 33 in order to read the read data Dr from the resource 13, as shown in FIGS. 9B-9D. Then, the output circuit 19 of the controller 33 outputs the select signal RS2 to the AND gate 51. Then, the AND gate 51 outputs the read select signal RSr2 to the resource 13, as shown in FIG. 9E. Thus, the CPU 32 reads the read data Dr from the resource 13.

When the read data Dr is 0xE456 as shown in FIG. 9F, the data-to-signal converter 43 outputs the select signals RS1-RS3 to the multiplexers 44-46, respectively, in accordance with the conversion table 54 shown in FIG. 7. Thus, the AND gates 47-49 outputs the write select signals RSw1-RSw3 to the resources 12-14, respectively, as shown in FIG. 9G.

The data converter 34 converts the read data Dr of 0xE456 to the converted data CDr of 0x7456 in accordance with the conversion table 36 shown in FIG. 8. As shown in FIGS. 9G and 9H, the converted data CDr of 0x7456 is written to all the resources 12-14 at a time. Thus, the converted data CDr is written to all the resources 12-14 at the same time the CPU 32 reads the read data Dr from the resource 13.

In the microcomputer 31, when the CPU 32 reads the read data Dr from one of the resources 12-14, the data-to-signal converter 43 outputs at least one of the write select signals RSw1-RSw3. Thus, the read data Dr can be written to at least one of the resources 12-14 in the same cycle where the CPU 32 reads the read data Dr. Therefore, data transfer time between the resources 12-14 can be significantly reduced.

In the data transfer, the read data Dr may need to be converted to the converted data CDr. Since the data converter 34 converts the read data Dr to the converted data CDr, the CPU 32 has no need to convert the read data Dr. Thus, the data transfer time can be significantly reduced, even if the read data Dr needs to be converted to the converted data CDr. The multiplexer 35 selects the read data Dr or the converted data CDr so that needed data can be written to the resources 12-14.

(Modifications)

The embodiment described above may be modified in various ways. For example, the number of the resources and size of the data bus is variable.

In the microcomputer 31, the modes A, B may be optional, i.e., the mode switch register 41 may be optional. The data converter 34 may generate the converted data CDr by converting a whole portion of the read data Dr. The data converter 34 may be optional.

The CPU 32 may have a coprocessor or an accelerator that includes the structure of the microcomputer 31. In this case, the CPU 32 sends an instruction to the coprocessor or the accelerator to cause the coprocessor or the accelerator to perform the same function as the microcomputer 31.

The size of the data bus of the CPU 32 is different from that of each of the resources 12-14. For example, the data bus of the CPU 32 may have a width of 16 bits and the data bus of each of the resources 12-14 may have a width of 96 bits. In such an approach, the 96-bit data can be transferred between the resources 12-14 at the same time the CPU 32 reads 16 bits of the 96-bit data in read cycle.

Such changes and modifications are to be understood as being within the scope of the present invention as defined by the appended claims.

What is claimed is:

1. A microcomputer comprising:
   a central processing unit (CPU) that outputs an address signal;
   a plurality of resources is configured to be writable by the central processing unit each resource having a unique address identified by the CPU; and
   an output circuit including an address decoder configured to decode the an address signal output by the CPU into a decoded address signal
   the output circuit being configured to output a plurality of select signals based on the decoded address signal,
   each of the resources being configured to receive a corresponding one of the plurality of select signals from the output circuit, and each of the resources being made writable upon receiving corresponding select signal,
   the number of the plurality of select signals simultaneously outputted by the output circuit being configured to vary depending on the decoded address signal, and
   when the address signal output by the CPU indicates a predetermined address, the output circuit simultaneously outputs at least two of the plurality of select signals based on the decoded address signal to write to at least two of the resources corresponding to the at least two select signals.

2. The microcomputer according to claim 1, wherein the output circuit includes a plurality of OR gates each of which has an output terminal connected to a corresponding one of the plurality of resources, and the decoded address signal is input to at least one of the plurality of OR gates.

3. The microcomputer according to claim 1, wherein the decoded address signal comprises a plurality of decoded address signals, each of the decoded address signals being associated with a corresponding one of the plurality of resources,
   the output circuit further includes a plurality of multiplexers each of which has an output terminal connected to a corresponding one of the plurality of resources, a plurality of AND gates each of which has an output terminal connected to a first input terminal of a corresponding one of the plurality of multiplexers, and a register circuit having a control bit that outputs a control bit signal to a control terminal of each of the plurality of multiplexers when being set and a plurality of select bits each of which outputs a bit signal to a first input terminal of a corresponding one of the plurality of AND gates when being set to,
   one of the plurality of decoded address signals being inputted to a second input terminal of each of the plurality of AND gates,
   each of the plurality of decoded address signals being inputted to second input terminal of the corresponding one of the plurality of multiplexers,
   each of the plurality of multiplexers selects the second input terminal side in response to the control bit signal, and
   when the address signal indicates the predetermined address, the control bit is set and at least two of the plurality of select bits are simultaneously set.

4. The microcomputer according to claim 1, the output circuit further including a data-to-signal converter that generates another select signal by decoding a first portion of first data that is read by the CPU from one of the plurality of resources,
   the another select signal being received by at least two of the plurality of resources, and
   the first data is simultaneously written to the at least two of the plurality of resources.

5. The microcomputer according to claim 4, further comprising:
   a data converter that generates second data by converting a second portion of the first data, wherein the second data being simultaneously, written to the at least two of the plurality of resources.

6. The microcomputer according to claim 5, further comprising:
   another multiplexer that selects the first data or the second data and outputs the selected data to the at least two of the plurality of resources.

7. The microcomputer according to claim 1,
   the predetermined address comprising plural different predetermined addresses, each of the different predetermined addresses being assigned to a different predetermined combination of the at least two of the resources, a single different predetermined address causing the output circuit to simultaneously output the at least two select signals for the different predetermined combination of the at least two of the resources.

8. The microcomputer according to claim 7,
   the CPU being configured to write data to the resources through the output circuit, the data being written at one time to only the at least two of the resources, when the CPU writes data and the at least two select signals are simultaneously outputted by the output circuit.

9. The microcomputer according to claim 7, each of the different predetermined addresses corresponding to a different peripheral separately addressable by the CPU via the resource, the single different predetermined address causing the output circuit to simultaneously select the at least two of the resources corresponding to at least two different peripherals.

* * * * *